United States Patent [19]

Paynton

[11] Patent Number: 4,643,785
[45] Date of Patent: Feb. 17, 1987

[54] METHOD OF MANUFACTURING A FILTER

[76] Inventor: Richard D. Paynton, P.O. Box 889, Doylestown, Pa. 18901

[21] Appl. No.: 707,417

[22] Filed: Mar. 1, 1985

Related U.S. Application Data

[62] Division of Ser. No. 442,633, Nov. 18, 1982, Pat. No. 4,514,585.

[51] Int. Cl.$^4$ ............................................. H05K 9/00
[52] U.S. Cl. ...................... 156/101; 156/99; 156/154; 156/196; 156/275.5; 156/307.7; 156/246; 156/344; 264/25; 264/40.2; 264/320; 264/1.7
[58] Field of Search ............... 156/64, 99, 101–106, 156/153–154, 196, 212, 272.2, 273.7, 273.9, 275.5, 275.7, 297–300, 307.1, 307.3, 307.7, 331.7, 246, 344; 174/35 R, 35 MS, 356 GC; 219/10.55 D; 428/245–246, 253.4, 256, 261, 325; 358/245; 264/139, 25, 257, 259, 40.2, 339, 320, 294, 273, 1.7, 1.9; 430/6, 496

[56] References Cited

U.S. PATENT DOCUMENTS

| | | | |
|---|---|---|---|
| 2,481,809 | 9/1949 | Barnes | 264/1.7 |
| 2,674,644 | 4/1954 | Goodloe | 174/35 |
| 2,842,473 | 7/1958 | Oberly et al. | 156/246 |
| 2,875,435 | 2/1959 | McMillan | 343/18 |
| 2,948,051 | 8/1960 | Eisler | 264/139 |
| 2,977,412 | 3/1961 | Rhodes et al. | 358/252 |
| 3,030,435 | 4/1962 | Andrews | 174/35 |
| 3,126,440 | 3/1964 | Goodloe | 174/35 |
| 3,265,804 | 8/1966 | Berger et al. | 174/35 |
| 3,305,623 | 2/1967 | Bakker et al. | 174/35 |
| 3,431,348 | 3/1969 | Nellis et al. | 174/35 |
| 3,533,897 | 10/1970 | Robbins, Jr. | 156/246 |
| 3,888,711 | 6/1975 | Breitner | 156/106 |
| 4,008,383 | 2/1977 | Tanaka et al. | 174/35 |
| 4,010,343 | 3/1977 | Tanaka et al. | 174/35 |
| 4,037,009 | 7/1977 | Severinsen | 174/35 |
| 4,040,888 | 8/1977 | Soska | 156/104 |
| 4,163,821 | 8/1979 | Nienart et al. | 428/245 |
| 4,247,737 | 1/1981 | Johnson et al. | 174/35 |
| 4,253,737 | 3/1981 | Thomsen | 358/252 |
| 4,264,800 | 4/1981 | Jahnke | 126/200 |
| 4,272,589 | 6/1981 | Dubois | 156/99 |
| 4,285,757 | 8/1981 | Mori | 156/379 |
| 4,381,421 | 4/1983 | Coats et al. | 174/35 |

OTHER PUBLICATIONS

Tecknit Data Sheet 711 entitled Cast-EMC Windows.
Shield-Vu EMI/RFI Shielded Windows, pp. 92–94.
Technit Data Sheet 710 entitled EMC-GLAS Windows Technical Wire Products, Inc., Copyright 1978.

Primary Examiner—Michael Wityshyn
Assistant Examiner—Merrell C. Cashion, Jr.
Attorney, Agent, or Firm—Howson and Howson

[57] ABSTRACT

A filter for use in combination with a cathode ray tube screen to transmit light and absorb other types of energy comprises a translucent plastic substrate onto which is applied a wire mesh impregnated with a thin layer of a bonding agent which constitutes one surface of the filter. In manufacturing the filter, a thin layer of the bonding agent is deposited on the topside of a platen, and the mesh is pressed into the bonding agent to cause it to impregnate the mesh. The translucent plastic substrate is placed on the impregnated mesh, and pressure is applied between the substrate and the platen to form a laminate. Thereafter, the laminate is cured and separated from the platen, after which it may be placed in a mold and formed into a curved shape.

10 Claims, 15 Drawing Figures

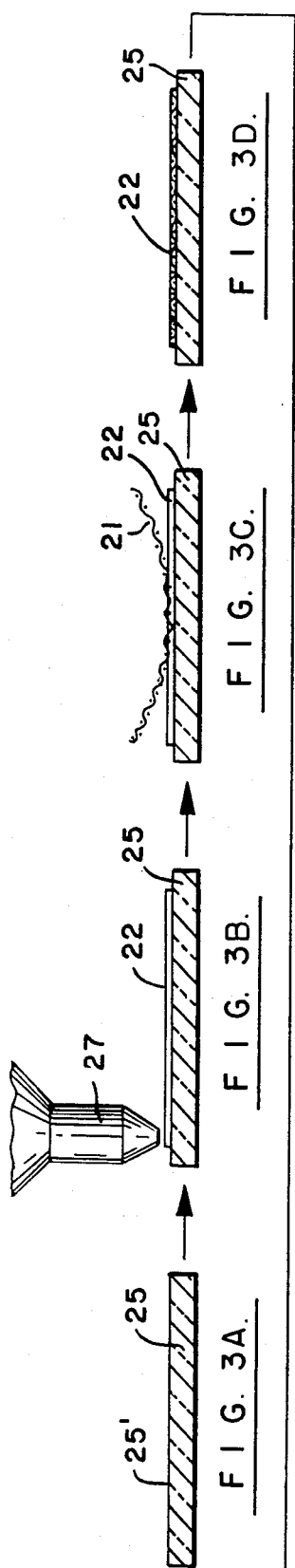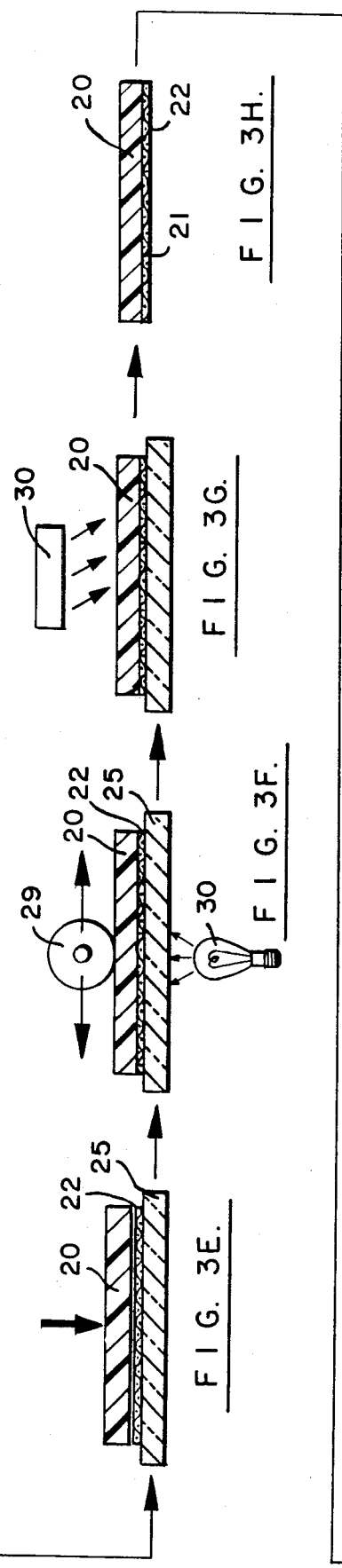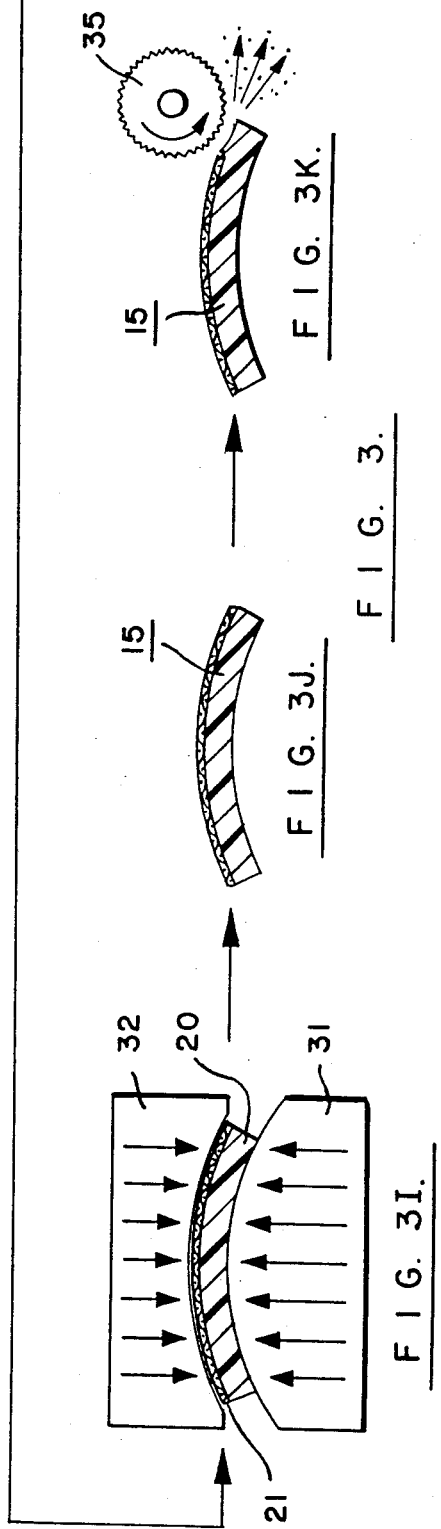

METHOD OF MANUFACTURING A FILTER

CROSS REFERENCE TO RELATED APPLICATION

The present application is a division of copending application Ser. No. 442,633, filed on Nov. 18, 1982 and entitled "Filter and Method of Manufacturing", now U.S. Pat. No. 4,514,585, Dated Apr. 30, 1985.

FIELD OF THE INVENTION

The present invention relates to filters, and more particularly, the present invention relates to a method of manufacturing filters for use in transmitting light while absorbing other forms of energy emitted by cathode ray tubes.

BACKGROUND OF THE INVENTION

In recent years, the widespread use of devices having cathode ray tube (CRTs) has created certain problems. For instance, computer terminals, televisions, and video games are known to have increased the amount of stray energy emitted into the environment in the vicinity of such devices. The art commonly refers to such energy as electromagnetic energy interference (EMI) or radio frequency interference (RFI). There is a need, not only to protect people who may be particularly affected adversely by such interference (such as people having heart pacemakers) but also to protect sensitive electronic equipment from damage caused by such interference. Moreover, it is known that such energy can be intercepted and information obtained therefrom by sensitive electronic surveillance equipment.

While it is not difficult to shield CRT cabinets from both emission of, and penetration by, such forms of energy, it is difficult to provide satisfactory shields, or filters, for the screens of cathode ray tubes, and other information transmitting devices, such as light emitting diodes (LEDs). This is because of the need for operators to be able to read information from the devices with a minimum of optical distortion caused by the filter.

U.S. Pat. Nos. 3,305,623; 3,431,348; and 4,247,737 disclose viewing panels for use with cathode ray tubes to attenuate the transmission of energy across the front of the cathode ray tube screen. Each of these patented filters is characterized by a loosely knit mesh wire material laminated between transparent glass or plastic panels. Most of the filters of this type are flat, although curved laminated filters are commercially available.

Viewing panels particularly suited for use with microwave ovens are disclosed in U.S. Pat. Nos. 4,008,383; 4,010,343; and 4,264,800.

Various shielding devices for use in attenuating electromagnetic energy are disclosed in the following U.S. Pat. Nos. 2,674,644; 2,875,435; 3,030,435; 3,126,440; 3,265,804; and 4,037,009.

Various filters have been proposed for attenuating reflections of ambient light. For example, in U.S. Pat. No. 2,977,412 and U.S. Pat. No. 4,253,737, there are disclosed mesh type screens for use in combination with cathode ray tubes for this purpose. The former patent suggests the use of either metallic or synthetic fiber filaments. Neither patent, however, is concerned with the attenuating EMI or RFI energy.

U.S. Pat. No. 4,163,821 discloses an adhesive bonding procedure for providing mechanical stabilization of metallic glass ribbons in fabric form.

While each of the above noted patented inventions may function satisfactorily for its intended purpose, there is a demand for an improved cathode ray tube filter which provides energy attenuation capabilities, which is free from optical defects, and which is capable of being manufactured efficiently.

OBJECTS OF THE INVENTION

With the foregoing in mind, a primary object of the present invention is to provide a novel filter particularly suited for use in conjunction with a cathode ray tube screen to attenuate various types of energy passing through the screen.

It is another object of the present invention to provide an improved cathode ray tube screen filter which has EMI and RFI energy attenuation capabilities.

A further object of the present invention is to provide a unique cathode ray tube screen filter having excellent optical properties making it well suited for those applications where both light transmission and EMI and RFI energy attenuation capabilities are desired.

A still further object of the present invention is to provide an improved method of efficiently manufacturing a novel filter for a cathode ray tube screen.

SUMMARY OF THE INVENTION

More specifically, the present invention provides a filter which is adapted to be mounted in front a cathode ray tube screen to attenuate energy passing through the screen. The filter comprises a translucent substrate onto which a fine mesh of electrically-conductive filaments is bonded by a thin layer of bonding agent. Preferably, the substrate is a transparent plastic panel; the filaments are woven of wire mesh; and the bonding agent is a polyurethane. The wire mesh filaments are exposed along the peripheral margin of the panel for grounding the panel.

In manufacturing the filter, a layer of the bonding agent is deposited on the topside of a glass platen, and the wire mesh is forced downwardly into the layer of bonding agent and is impregnated thereby. The plastic panel substrate is then laid on the impregnated wire mesh, and pressure is applied between the plastic panel substrate and the platen to ensure intimate contact between the panel and the bonding agent. This assembly is thereafter cured to cause the impregnated mesh to adhere to the plastic panel substrate and thereby form a laminate. The laminate is subsequently separated from the topside of the platen and may be molded into various curved shapes depending on the desired end use. The preferred bonding agent includes a photo-initiated curing agent which is activated when subjected to ultraviolet light during the curing phase of the manufacturing process. After curing, the bonding agent is removed from the peripheral margin of the filter to expose the wire mesh.

BRIEF DESCRIPTION OF THE DRAWINGS

The foregoing and other objects, features and advantages of the present invention should become apparent from the following description when taken in conjunction with the accompanying drawings, in which:

FIG. 3 is a schematic diagram illustrating the process of manufacturing the filter illustrated in FIG. 2, with FIGS. 3A-3K thereof illustrating individual steps in the process.

DESCRIPTION OF THE PREFERRED EMBODIMENT AND METHOD

Figure 1:
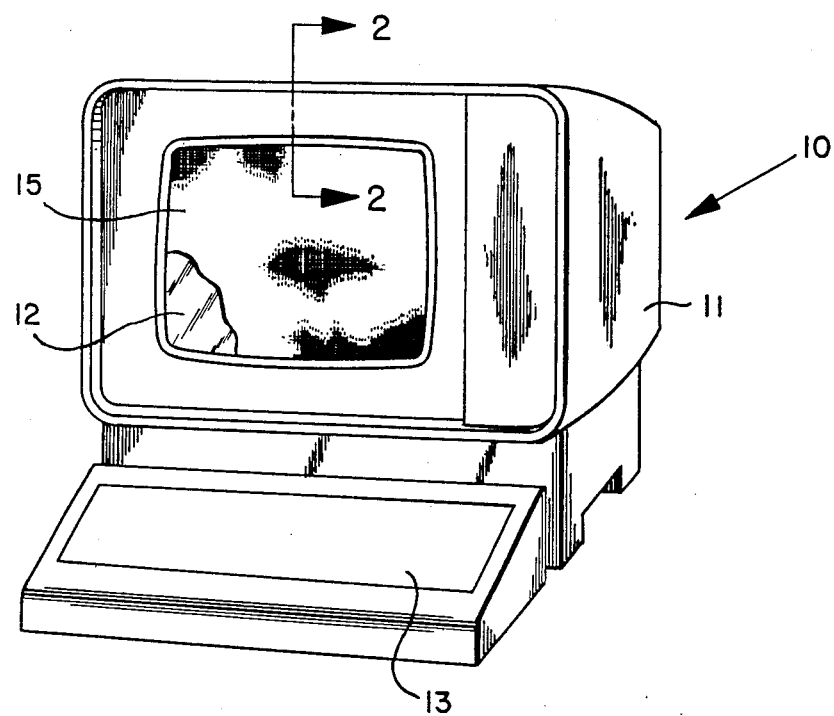
FIG. 1 is a perspective view illustrating a typical electronic device having a cabinet with a cathode ray tube screen mounted therein and a filter embodying the present invention mounted in front of the screen.

Referring now to the drawings, FIG. 1 illustrates a conventional cathode ray tube display device 10 with which the filter of the present invention finds particular utility. The device 10 comprises a cabinet 11 in which is mounted a cathode ray tube having a front face or screen 12 adapted to display information. In the illustrated embodiment, the device 10 is a computer terminal having a keyboard 13 in front the screen 12. While a computer terminal is illustrated, it should be understood, that the filter of the present invention may be used with a wide variety of electronic devices for which it is desirable to provide light transmission and energy absorption, such as video games, television receivers, light emitting diodes, etc.

As discussed heretofore, the electromagnetic energy emitted from the cathode ray tube screen 12 when the device 10 is in operation can cause the EMI and RFI problems noted heretofore. Moreover, even when the device 10 is not operating, it is possible for undesirable electromagnetic energy to flow in the reverse direction across the screen 12 and interfere with sensitive electronics housed within the device 10. Depending upon the level of the energy emitted or absorbed, and the proximity of sensitive electronic equipment, there is a need to provide shielding for the screen which both transmits light and absorbs unwanted energy.

Figure 2:
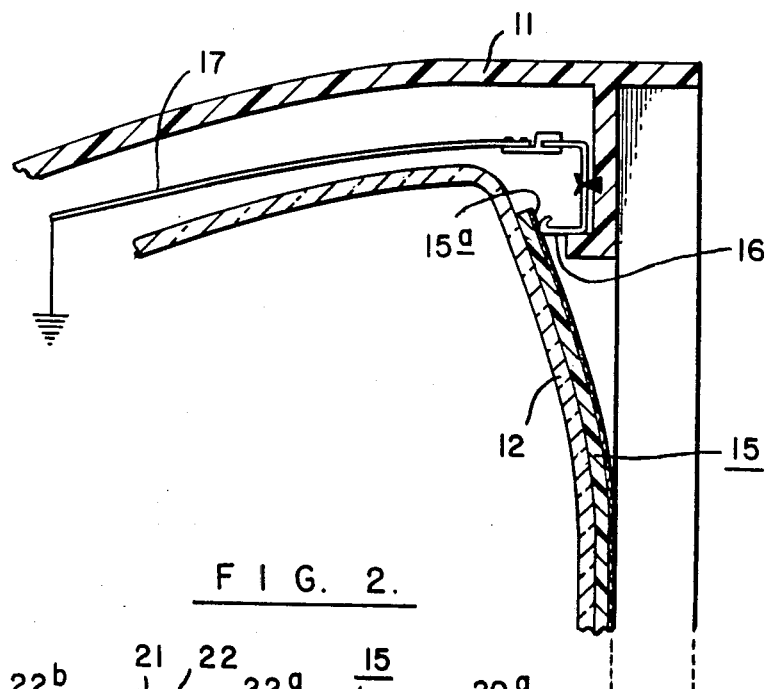
FIG. 2 is an enlarged fragmentary cross-sectional view taken on line 2—2 of FIG. 1.

In accordance with the present invention, a novel filter 15 has been provided to attenuate energy traversing the screen 12. To this end, and as best seen in FIG. 2, the filter 15 is mounted on the front of the cathode ray tube screen 12 in close proximity therewith, such as against its convex outer surface in the manner illustrated. Preferably, the cabinet 11 is provided with internal resilient supports, such as highly-conductive resilient gasketing formed of commercially-available conductive elastomeric material, or wire mesh, which engages the filter 15 around its entire periphery, or bus bars, such as the spring clip 16 for engaging the filter 15 at one or more spaced locations along its peripheral margin as indicated at 15a. Preferably, the clips 16 are electrically grounded by a suitable conductor 17.

Figure 2A:
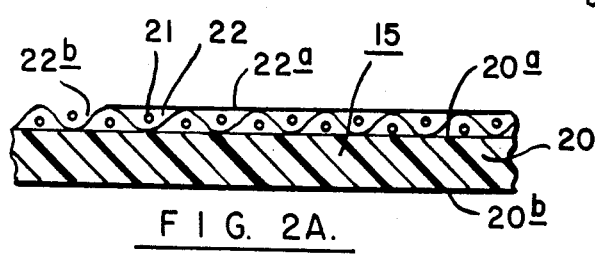
FIG. 2A is a greatly enlarged fragmentary sectional view of a portion of the filter.

As best seen in FIG. 2A, which is a greatly enlarged fragmentary sectional view of the filter 15, the filter 15 comprises a substrate 20 which is preferably formed of a transparent, or at least translucent, plastic. The substrate 20 has a front, or outer, surface 20a and a rear or inner surface 20b. In the illustrated embodiment, the front surface 20a is convex and the rear surface 20b is concave and is engaged against the front of the cathode ray tube screen 12 and held in place by the spring clip 16.

To absorb the EMI and RFI energy while transmitting light, a mesh 21 of electrically-conductive filaments is disposed against the outer surface 20a of the panel 20. As best seen in FIG. 2A, a thin layer of a bonding agent 22 impregnates the mesh 21 and covers the surface 20a of the panel 20 to a depth sufficient to completely encapsulate the mesh 21. The layer 22 provides an outer surface 22a which is parallel with the surface 20a of the panel 20 and which is substantially coextensive therewith. The bonding agent 22 adheres the mesh 21 to the panel 20 to provide a unitary filter assembly 15.

The translucent substrate or panel 20 is preferably fabricated of an acrylic plastic material such as sold by Rohm and Haas Co. of Philadelphia, Pa. under the trade designation Plexiglas. Other plastics which may be used include: polycarbonates, butyrates, vinyls and nylons. While the panel 20 may contain pigments to provide coloring and/or to absorb light of a particular wavelength, the panel 20 is preferably clear.

The mesh 21 which is superimposed on the panel 20 is preferably fabricated by weaving very small diameter electrically-conductive filaments in a conventional manner. Preferably, the filaments are formed of wire drawn from any one of the following metals: beryllium-copper, monel, tin, iron, tungsten, stainless steel and alloys thereof. The wires may be of a dark color formed by known blackening processes. Desirably, the wires have a diameter in the range of about 1.0 mil. to about 5 mils. The wires are preferably woven into a fabric of between about 50 mesh to about 300 mesh. Wire mesh of this construction is readily available from several commercial sources. A woven wire fabric of this construction has been found to be capable of being formed into a convex shape compatible with the curvatures of conventional cathode ray tube screens. While mesh woven of metal wires is preferred, knitted mesh may be utilized, if desired.

The wire mesh fabric 21 is bonded to the plastic panel substrate 20 by the thin layer of the bonding agent 22 which impregnates the woven wire mesh 21. The thickness of the bonding agent layer 22 is greater than the thickness of the woven wire mesh 20 by a small amount to insure that the surface 22a of the layer 22 is relatively smooth to the touch. Preferably, the layer 22 has a uniform thickness in a range of about 2.5 mils. to about 6 mils., when the woven wire mesh 21 is fabricated from wire having a diameter in a range of about 1.0 to about 5.0 mils.

The bonding agent 22 must be compatible with the filaments of the mesh 21 and the plastic of the substrate 20. Preferably, the bonding agent is a synthetic organic compound such as a polyurethane. A preferred polyurethane is manufactured by Pittsburgh Plate Glass Co. (PPG), of Oak Creek, Wis. and sold under the trade designation Raycron 400 UV/EB. It is characterized by a relatively low viscosity, clarity, and low glossiness. It is an acrylic polymer which has a viscosity of 350-450 cps. (Brookfield) and readily forms a film thickness in a 2.0-3.5 mil. range. It is also resistant to abrasion and marring upon curing. While a conventional curing agent may be used with the preferred bonding agent noted above, a preferred curing agent is of the photo-initiated type such as benzophenone or ethyl hexyl acrylate. Such a curing agent is activated when subjected to ultraviolet light for a brief time period. The bonding agent may include up to about 10%, by weight, of such curing agent, but more preferably in a range of about 2 to about 6%, by weight.

The filter 15 is grounded when installed in the cabinet 11 in the manner illustrated in FIGS. 1 and 2. To this end, means is provided on the filter 15 for making electrical contact with the filaments of the mesh along at least a portion of the peripheral margin thereof. In the illustrated embodiment, this is accomplished by providing a recess 22b (FIG. 2A) along at least a part of the periphery of the panel, and preferably, along the entire periphery. The recess 22b causes the mesh 21 to be exposed along the peripheral margin of the filter 15 inwardly a sufficient amount (about ½ inch) as to engage the electrical contact or bus 16 which is grounded. With this structure, EMI or RFI energy passing in either direction across the filter 15 is absorbed by the woven wire mesh 21 and conducted to ground via the bus 16 and lead 17. In addition, the mesh 21 functions to scatter and absorb ambient light impinging on the filter 15 to provide an anti-glare function, particularly when the filaments of the mesh are blackened.

In the embodiment illustrated, the wire mesh is bonded on the convex side of the substrate 20. While this is preferred, the mesh may be bonded onto the concave side if desired.

The filter 15 is manufactured by the novel process of the present invention. The process enables consistently high quality filters to be fabricated in an efficient manner without requiring highly skilled technicians and sophisticated equipment. The overall process is illustrated schematically in FIG. 3 with individual steps being illustrated in FIGS. 3A-3K.

Referring now to FIG. 3A, the process begins with there being provided a platen or work surface 25 larger in size than the area of the filter 15 to be fabricated. Preferably, the platen 25 is provided by translucent plate glass having a topside 25'. The topside 25' may be either smooth or may have a mottled or slightly roughened surface, depending upon the degree of smoothness to be imparted to the outer surface 22a of the bonding agent 22, as will be described. Glass is preferred because it will not adhere to the bonding agent used to adhere the wire mesh to the plastic substrate.

Referring now to FIG. 3B, the bonding agent is applied as a liquid in a thin uniform layer 22 on the topside 25' of the platen 25, as by a dispenser 27. The thickness of the layer 22 should be at least 2.5 mils., but may be up to about 6 mils., depending on various factors such as the diameter of the wires in the mesh 21. The area of the layer 22 is at least as great as the area of the filter panel substrate 20. Care should be taken to insure that the bonding agent is applied evenly to minimize the formation of bubbles, discontinuities, and the like.

After the bonding agent 22 has been applied in a layer on the platen 25, the precut woven wire mesh 21 is laid on the layer 22 in the manner illustrated in FIG. 3C. The mesh 21 is pressed downwardly into the layer 22 to cause the bonding agent 22 to flow into the interstices among the warp and weft wires and thereby to impregnate the mesh 21. See FIG. 3D. As noted above, the depth, or thickness, of the layer 22 should be selected to ensure that individual wires of the mesh remain below the surface 22a of the bonding agent layer in the finished filter 15 as shown in FIG. 2A.

Next, the impregnated mesh 21 is bonded to the plastic substrate 20. As best seen in FIG. 3E, this is accomplished by aligning the plastic substrate 20 with the layer of bonding agent 22 on the platen 25 and laying the substrate 20 downwardly thereon. Thereafter, downward pressure is applied between the topside of the plastic substrate 20 and the platen 25 to ensure intimate contact between the underside of the substrate 20 and the impregnated mesh 22. Preferably, pressure is applied by engaging a roller 29 against the topside of the substrate 20 and rolling it back and forth in various directions. The rolling action presses the panel substrate 20 firmly downwardly against the impregnated mesh 21. Alternatively, the pressure may be applied by passing the substrate 20 relative to one or more rollers to ensure the desired uniform dispersion.

In order to expel any air or gas bubbles which may be entrained within the bonding agent, either during application onto the platen 25 as illustrated in FIG. 3B, or during manipulation of either the mesh 21 or substrate 20, it is preferable for the underside of the platen 25 to be illuminated by a source of light, such as the light 30. The light 30 is preferably of the fluorescent type and of sufficient size as to illuminate the entire underside of the platen 25. The light passing upwardly through the platen 25 also passes through the impregnated mesh 21 and the plastic substrate 20 to expose air or gas bubbles and other discontinuities to the technician operating the roller 29 on the topside of the substrate 20. As a result, the technician is able to adjust the rolling action and/or pressure to expel the bubbles and to ensure continuous contact between the bonding agent 22 and the entire undersurface of the plastic panel substrate 20.

After all of the bubbles and/or other irregularities in the impregnated mesh layer 22 have been removed, the bonding agent is cured to harden its outer surface 22a and to bond the wire mesh 21 to the panel 20. In the present invention, the bonding agent includes up to about 10%, but preferably about 2 to 6%, by weight of the photo-initiated curing agent noted heretofore. Thus, when subjected to ultraviolet light, such as emitted from the source 30 overlying the plastic substrate 20 in FIG. 3G, the curing agent is activated to harden the bonding agent. Of course, should other types of curing agents be utilized, such as thermally-activated curing agents, the light source 30 may be replaced with a suitable source of heat, such as an infrared lamp.

After curing, the laminated assembly comprising the plastic substrate 20 with the bonding agent 22 carrying the mesh 21 is removed from the glass platen 25. See FIG. 3H. This is accomplished simply by prying the edges of the laminated assembly 20-21 from the platen 25 and lifting the same upwardly with respect to the glass platen 25. If desired, the wire mesh 21 may be cut larger than needed to cover the panel 20 so that it extends beyond the edges of the panel 20. In such event, the amount of mesh and bonding agent extending beyond the edge of the panel 20 may be trimmed and discarded.

The panel 15 of the present invention is capable of being molded into various curved and convex shapes compatible with the curvatures of the screens of various cathode ray tubes. To this end, the laminate assembly 20-22 is placed in a mold assembly comprising a mating set of a male mold member 31 and a female mold member 32. See FIG. 3I. The mold members 31 and 32 may be curved in either a single plane or in orthogonal intersecting planes, depending upon the desired geometry of the finished filter 15. While it is preferable for the laminate assembly 20-22 to be formed with the impregnated mesh 21 on the convex surface of the plastic substrate 20, as shown in FIG. 3I, it may be molded with the mesh 21 on the concave side. Molding is accomplished by applying heat and pressure between the mold members 31 and 32 as well known in the art. By way of example, pressure applied in a range of about 0.85 to about 1.15 psi. and heat applied in a temperature range of about 280° F. to about 300° F. for about 5 to about 10 minutes should yield a satisfactory finished filter 15. After the requisite heat and pressure has been applied as illustrated in FIG. 3I, the filter 15 is removed from the mold and allowed to cool to ambient room temperature. The filter 15 has the convex shape illustrated in FIG. 3J.

As noted heretofore, in order to ground the wires of the mesh 21 when the filter is installed in a cabinet, the bonding agent 22 is removed along portions of the outer peripheral margin of the panel 20 to provide the recess 22b and expose the wires of the mesh 21. This may be accomplished in any one of several ways. One preferred way is simply to grind away the hardened bonding agent 22 by means of an abrasive, or wire, wheel 35, such as indicated schematically in FIG. 3K. Because the wires are metal and more abrasion resistant than the bonding agent 22, this technique ensures exposure of the underlying wires of the mesh 21 to enable electrical contact to be made with the contacts 16 mounted in the cabinet 11 as illustrated in FIG. 2. If desired, the recess 22b may be formed and the wires exposed by subjecting the margin of the panel 15 to a selective solvent which removes only the bonding agent 22. Or, the central portion of the panel may be masked and the peripheral margin sand blasted to expose the wires of the mesh 21.

In view of the foregoing, it should be apparent that the present invention now provides an improved filter for absorbing EMI and RFI energy while simultaneously allowing information on a cathode ray tube screen to be viewed readily. Because the filter is shaped to fit the curvature of the screen, optical distortions are kept to a minimum. Furthermore, the method of the present invention enables the filter 15 to be manufactured economically with a minimum of special equipment and skilled technicians.

While a preferred embodiment of the present invention, and a preferred process for making the same, has been described in detail, various modifications, alterations and changes may be made without departing from the spirit and scope of the present invention as defined in the appended claims.

What is claimed is:

1. A method of manufacturing a filter adapted to transmit visible light while absorbing certain other forms of energy, said method comprising the steps of:
    providing a platen having a topside,
    depositing on said topside a layer of liquid bonding agent which, when cured, is releasable from said topside,
    placing in said layer of bonding agent a mesh fabricated of electrically-conductive filaments to cause said bonding agent to impregnate said mesh,
    laying on said impregnated mesh a translucent plastic substrate,
    applying pressure between said substrate and said platen,
    curing said bonding agent to cause the impregnated mesh to adhere only to said substrate and to form a laminate, and
    separating said laminate from said platen topside.

2. The method according to claim 1 including the step of projecting light upwardly through said platen and substrate during said pressure applying step to afford visual observation of the flow of said bonding agent in said layer.

3. The method according to claim 1 wherein said pressure applying step includes the step of engaging a roller against said substrate and moving said roller relative to said substrate while applying pressure toward said platen.

4. The method according to claim 1 wherein said bonding agent includes a photo-initiated curing agent, and said curing step includes the step of subjecting said laminate to ultraviolet light.

5. The method according to claim 1 including the step of molding said laminate under heat and pressure into a curved structure.

6. The method according to claim 5 wherein during said molding step said laminate is formed into a curved shape having convex and concave surfaces with said impregnated mesh forming at least one of said surfaces.

7. The method according to claim 6 wherein said molding step is carried out in a male-female mold pair adapted to apply pressure in a range of about 0.85 to about 1.15 psi. and heat at a temperature in a range of about 280° F. to about 300° F. for a time in a range of about 5 to about 10 minutes.

8. The method according to claim 1 including the step of removing said layer of said bonding agent along at least a portion of the periphery of said laminate to expose said mesh filaments.

9. The method according to claim 1 wherein said bonding agent is applied in a layer of uniform thickness in a range of about 2.5 to about 6 mils. on said substrate to form a continuous surface thereon in which said mesh is embedded.

10. The method according to claim 1 wherein said substrate includes a plastic material, said mesh is fabricated of metal wires, and said bonding agent includes a synthetic organic compound having a photo-initiated curing agent.

* * * * *